United States Patent
El-Kareh et al.

(10) Patent No.: US 9,076,835 B2
(45) Date of Patent: Jul. 7, 2015

(54) VERTICALLY BASE-CONNECTED BIPOLAR TRANSISTOR

(71) Applicant: Micron Technology, Inc., Boise, ID (US)

(72) Inventors: Badih El-Kareh, Cedar Park, TX (US); Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 80 days.

(21) Appl. No.: 13/855,354

(22) Filed: Apr. 2, 2013

(65) Prior Publication Data

US 2013/0214847 A1    Aug. 22, 2013

Related U.S. Application Data

(62) Division of application No. 11/717,462, filed on Mar. 13, 2007, now Pat. No. 8,409,959.

(51) Int. Cl.
| | |
|---|---|
| *H01L 29/80* | (2006.01) |
| *H01L 29/73* | (2006.01) |
| *H01L 21/8249* | (2006.01) |
| *H01L 27/06* | (2006.01) |
| *H01L 29/66* | (2006.01) |
| *H01L 29/732* | (2006.01) |
| *H01L 29/737* | (2006.01) |
| *H03K 17/60* | (2006.01) |

(52) U.S. Cl.
CPC ............ *H01L 29/73* (2013.01); *H01L 21/8249* (2013.01); *H01L 27/0623* (2013.01); *H01L 29/66287* (2013.01); *H01L 29/732* (2013.01); *H01L 29/7371* (2013.01); *H03K 17/60* (2013.01)

(58) Field of Classification Search
CPC ............... H01L 29/66242; H01L 29/1004; H01L 29/7378; H01L 21/8249; H01L 29/66287; H01L 29/732; H01L 29/66272; H01L 27/0623; H01L 21/82285; H01L 29/66265; H01L 29/73; H01L 29/7371; H03K 17/60
USPC .................................................. 257/565–579
See application file for complete search history.

(56) References Cited

U.S. PATENT DOCUMENTS

| | | | |
|---|---|---|---|
| 5,017,990 A | 5/1991 | Chen et al. | |
| 5,439,833 A * | 8/1995 | Hebert et al. | ............... 438/203 |
| 5,552,626 A | 9/1996 | Morikawa | |
| 6,750,528 B2 | 6/2004 | Chyan | |
| 7,335,547 B1 | 2/2008 | U'Ren | |
| 2002/0096678 A1 | 7/2002 | Chyan | |

(Continued)

OTHER PUBLICATIONS

Bock, J., et al. "Sub 5 ps SiGe Bipolar Technology". Digest of the IEEE International Electron Devices Meeting, San Francisco (2002), pp. 763-766.

(Continued)

*Primary Examiner* — H Tsai (74) *Attorney, Agent, or Firm* — Brooks, Cameron & Huebsch, PLLC (57) ABSTRACT

Methods, devices, and systems for using and forming vertically base-connected bipolar transistors have been shown. The vertically base-connected bipolar transistors in the embodiments of the present disclosure are formed with a CMOS fabrication technique that decreases the transistor size while maintaining the high performance characteristics of a bipolar transistor.

15 Claims, 6 Drawing Sheets

(56) References Cited

U.S. PATENT DOCUMENTS

| | | |
|---|---|---|
| 2004/0222495 A1 | 11/2004 | Cantell et al. |
| 2005/0035431 A1 | 2/2005 | Masuda |
| 2006/0099770 A1* | 5/2006 | Bromberger .................. 438/400 |

OTHER PUBLICATIONS

Burghartz, J.N., et al. "Sub-30ps ECL Circuits Using . . . ". Digest of the IEEE International Electron Devices Meeting, San Francisco (1990), pp. 297-300.

Chen, T.C., et al. "Submicrometer Si and Si—Ge Epitaxial-Base . . . ". IEEE Trans. Elect. Dev. 38 (1991), pp. 941-943.

Crabbe, E.F., et al. "Vertical Profile Optimization of Very High Frequency . . . ". Digest of the IEEE International Electron Devices Meeting, Washington (1993), pp. 83-86.

Cressler, John D. "SiGe HBT Technology: A New Contender for Si-Based . . . ". IEEE Trans. Microwave Theory and Techniques, vol. 46, No. 5 (1998), pp. 572-589.

De Graff, H. C., et al. "The SIS Tunnel Emitter: A Theory for Emitters . . . ". IEEE Trans. Electron Devices, vol. 26, No. 11 (1979), pp. 1771-1776.

El-Kareh, B., et al. "A 5V Complementary-SiGe BiCMOS Technology for . . . ". Proceedings of the BCTM, Toulouse (2003), pp. 211-214.

Gruhle, Andreas. "Prospects for 200 GHz on Silicon with SiGe Heterojunction Bipolar Transistors". Proceedings of the 2001 IEEE Bipolar/BiCMOS Circuits and Technology, pp. 2-5.

Harame, D.L,. et al. "High Performance Si and SiGe-Base PNP Transistors". Digest of the IEEE International Electron Devices Meeting, San Francisco (1988), pp. 889-891.

Harame, D.L., et al. "Si/SiGe Epitaxial-Base Transistors—Part I: Materials, Physics and Circuits". IEEE Trans. Elect. Dev., vol. 42, No. 3 (1995), pp. 455-468.

Heinemann, B., et al. "A Complementary BiCMOS Technology with High . . . ". Technical Digest of the IEEE International Electron Devices Meeting, Washington (2003), pp. 117-120.

Hergenrother, J.M., et al. "The Vertical Replacement-Gate (VRG) MOSFET . . . ". Digest of the IEEE International Electron Devices Meeting, Washington (1999), pp. 75-78.

Johnson, F. Scott, et al. "A Highly Manufacturable . . . ". Proceedings of the 2001 IEEE Bipolar/BiCMOS Circuits and Technology, pp. 56-60.

Kasper, E., et al. "High Speed SiGe-HBT With Very Low Base Sheet Resistivity". Digest of the IEEE International Electron Devices Meeting, Washington (1993), pp. 79-81.

Knoll, D., et al. "Si/SiGe:C Heterojunction Bipolar Transistors in an Epi-Free . . . ". Digest of the IEEE International Electron Devices Meeting, San Francisco (1998), pp. 703-706.

Kondo, Masao, et al. "Ultra-Low-Power and High-Speed SiGe Base Bipolar . . . ". IEEE Trans. Elect. Dev., vol. 45, No. 6 (1998), pp. 1287-1294.

Lanzerotti, L.D., et al. "Si/Si1-x-yGexCy/Si Heterojunction Bipolar . . . ". Digest of the IEEE International Electron Devices Meeting, San Francisco (1994), pp. 930-932.

Meister, T.F., et al. "SiGe Base Bipolar Technology with 74 GHz . . . ". Digest of the IEEE International Electron Devices Meeting, Washington (1995), pp. 739-742.

Nguyen-Ngoc, D., et al. "Ion-Implanted Base SiGe PNP Self-Aligned . . . ". Proceedings of the 1991 IEEE Bipolar/BiCMOS Circuits and Technology, pp. 75-78.

Orner, B.A. et al. A 0.13 m BiCMOS Technology Featuring a 200/280 . . . . Proceedings of the 2003 IEEE Bipolar/BiCMOS Circuits and Technology, pp. 203-206.

Osten, H.J., et al. "Carbon Doped SiGe Heterojunction Bipolar Transistors . . . ". Proceedings of the 1999 IEEE Bipolar/BiCMOS Circuits and Technolgy, pp. 109-116.

Racanelli, Marco, et al. "SiGe BiCMOS Technology for Highly Integrated Wireless Transceivers". Technical Digest of the IEEE GaAs (2003), pp. 183-186.

Racanelli, M. et al. "Ultra High Speed SiGe NPN for Advanced BiCMOS Technology". Digest of the IEEE International Electron Devices Meeting, Washington D.C. (2001), pp. 336-339.

Rieh, J.S., et al. "SiGe HBTs with Cut-off Frequency of 350GHz". Digest of the IEEE International Electron Devices Meeting, San Francisco (2002), pp. 771-774.

Sato, Fumihiko, et al. "A Super Self-Aligned Selectively Grown SiGe Base (SSSB) . . . ". IEEE Trans. Electron Devices, vol. 41, No. 8 (1994), pp. 1373-1378.

Schuppen, A., et al. "Enhanced SiGe Heterojunction Bipolar Transistors . . . ". Digest of the IEEE International Electron Devices Meeting, Washington (1995), pp. 743-746.

Stork, J.M.C., et al. "SiGe Heterojunction Bipolar Transistors". Symposium on VLSI Technology, Kyoto (1989), pp. 1-4.

Warnock, J., et al. "35 GHZ/35 PSEC ECL PNP Technology". Digest of the IEEE International Electron Devices Meeting, San Francisco (1990), 301-304.

* cited by examiner

VERTICALLY BASE-CONNECTED BIPOLAR TRANSISTOR

PRIORITY APPLICATION INFORMATION

This application is a Divisional of U.S. application Ser. No. 11/717,462, filed Mar. 13, 2007, to be issued as U.S. Pat. No. 8,409,959, on Apr. 2, 2013, the specification of which is incorporated herein by reference.

TECHNICAL FIELD

The present disclosure relates generally to transistors and, more particularly, to vertically base-connected bipolar transistors.

BACKGROUND

A continuing challenge in the semiconductor industry is to find nanoscale transistors that have sufficient performance characteristics for use in today's advanced electrical applications. Bipolar transistors tend to have improved performance characteristics as compared to CMOS transistor configurations.

For example, ultra-high speed bipolar transistors such as SiGe and SiGe:C npn transistors have been demonstrated with gain-bandwidth products as high as 350 GHz. Some bipolar SiGe and SiGe:C pnp transistors demonstrate cutoff frequencies in the range of 25-115 GHz. Unfortunately, bipolar transistors can often be large in size, which can limit their use in nanoscale applications.

On the other hand, achieving comparable performance characteristics with CMOS transistors at the nanoscale level can be costly due to increased processing complexity and/or increased power consumption associated with CMOS transistor fabrication and/or performance. Therefore, it can be beneficial to produce bipolar transistors having a reduced size for use in nanoscale applications.

DETAILED DESCRIPTION

Embodiments of the present disclosure illustrate systems, methods, and devices for using and making vertically base-connected bipolar transistors. One method embodiment for forming a vertically base-connected bipolar transistor includes forming a bipolar transistor that includes a collector on a semiconductor substrate, a single crystal silicon pillar, an emitter on top of the pillar, and a base of appropriate profile between emitter and collector. The method includes forming the single crystal silicon pillar above the collector using CMOS fabrication techniques. In one embodiment for forming vertically base-connected bipolar transistors the method includes forming the transistors in a complementary npn and pnp configuration.

Forming the collector in an embodiment of a vertically base-connected bipolar transistor includes forming the collector by implanting, or by other known doping techniques, a buried $N^+$ layer. The emitter is formed by, e.g., implanting an $N^+$ dopant in a polysilicon layer, or by depositing an in-situ n-type doping polysilicon film. In various embodiments, the single crystal silicon pillar is formed in several steps. Depositing alternating layers of different etch properties, preferably oxide, doped oxide, and nitride, over an $N^+$ silicon substrate begins the process. An opening is formed through the layers of oxide and nitride. The single crystal silicon pillar is formed by selectively growing single crystal silicon in the opening.

In various embodiments a base of a vertically base-connected bipolar transistor includes a silicon germanium (SiGe) or silicon-germanium-carbon (SiGe:C) profile in the single crystal silicon pillar that forms an intrinsic SiGe base region. An extrinsic base region can be formed by depositing a nitride spacer, selectively removing the underlying oxide layer, and depositing a boron-doped base polysilicon layer in the void left by the removal of the oxide layer. The two base regions, extrinsic and intrinsic, are then linked by forming a base link between the intrinsic and extrinsic base regions.

Various embodiments of the present disclosure include vertically base-connected bipolar transistors in analog, radio frequency, digital, and memory applications. The vertically base-connected bipolar transistors in these applications provide speed, precision, and gain advantages over complementary metal-oxide-semiconductor (CMOS) transistors.

In one embodiment of the present disclosure, a bipolar circuit is formed that includes an array of complementary vertically oriented base-connected bipolar transistors. The array of complementary vertically oriented base-connected bipolar transistors can be integrated with CMOS in a bipolar complementary metal oxide semiconductor (BiCMOS) technology and system on a chip (SoC) design. The array of complementary vertically oriented base-connected bipolar transistors includes a collector on a semiconductor substrate, a vertically grown single crystalline silicon pillar, an emitter formed from a polysilicon layer, and a vertically grown single crystal layer formed separated from the collector by a number of oxide nitride layers.

The complementary vertically oriented base-connected bipolar transistors in the memory array also include a base between emitter and collector. The base includes a vertical base contact with an intrinsic base region formed in the single crystalline silicon pillar with a dopant driven from the emitter and an extrinsic base region. In various embodiments, the memory array includes circuitry for control and access to the array of complementary vertically base-connected bipolar transistors.

In various embodiments, operating a vertically base-connected bipolar transistor includes sending a first base signal to turn on a transistor. The transistor has a collector on a semiconductor substrate, an emitter with a polysilicon layer and a single crystal layer formed in a thermal cycle, and vertical base contacts with an intrinsic base region and an extrinsic base region that are configured to turn on when a first signal is received. A second base signal can then be sent to the transistor to turn off a transistor. The transistor operates by receiving a series of signals that can turn on the transistor or turn off the transistor.

Several examples of transistors that have been previously developed are provided in FIGS. 1-3 and described in the following paragraphs. The bipolar transistor shown in FIGS. 1A-1D is an epitaxial-base double-poly self-aligned bipolar transistor. The transistor in FIGS. 1A-1D is formed using the epitaxy after sidewall approach.

Figure 1A:
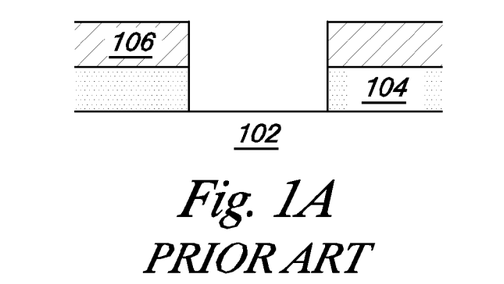
FIGS. 1A-1D illustrate a bipolar transistor configured as an epitaxial-base double-poly self-aligned bipolar transistor.
Figure 1B:
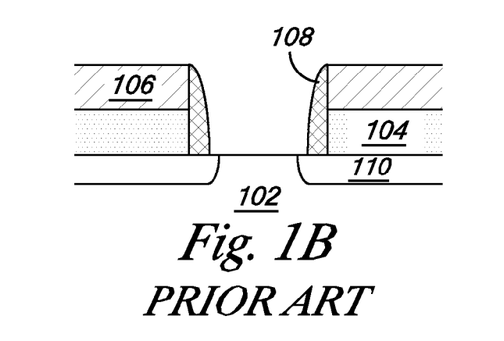
Figure 1C:
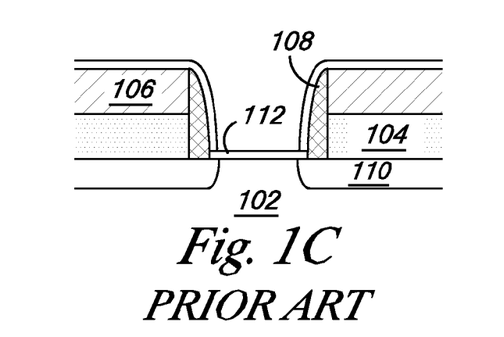
Figure 1D:
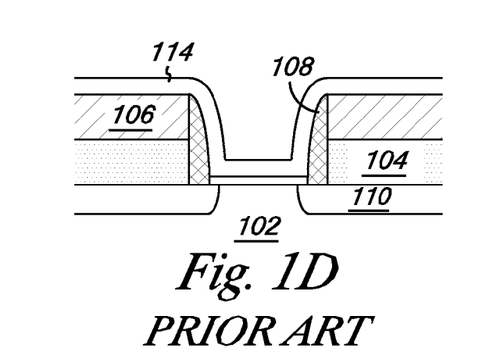

FIG. 1A shows an n-type single crystal silicon substrate that constitutes the collector 102 of the transistor. A heavily doped p-type polysilicon layer 104 is deposited on the n-type silicon. The p-type polysilicon is covered with by a silicon dioxide ($SiO_2$) layer 106. An opening is then patterned in these layers. In FIG. 1B, oxide spacers 108 are illustrated. The oxide spacers 108 are deposited on the sidewall of the polysilicon layer 104 and $SiO_2$ layer 106 and directionally etched. Boron is diffused from the p-type polysilicon into the single crystal silicon to form a connection 110 with the subsequently formed base. FIG. 1C shows a low temperature epitaxial Silicon Germanium (SiGe) base 112 that is deposited in the opening. The base grows as single crystal over the n-type single crystal silicon and as a poly over the existing boron doped poly. In FIG. 1D, an n-type polysilicon layer 114 is deposited over the $SiO_2$ layer 106 and over the oxide spacers 108 and the SiGe base 112 in the opening to form the emitter. A short thermal cycle diffuses arsenic in the single crystal and poly regions of the base. The transistor is completed by using standard patterning and processing techniques. The bipolar transistor in FIG. 1D requires additional area to accommodate the spacers and vertical-lateral diffusion to connect extrinsic and intrinsic base.

Figure 2A:
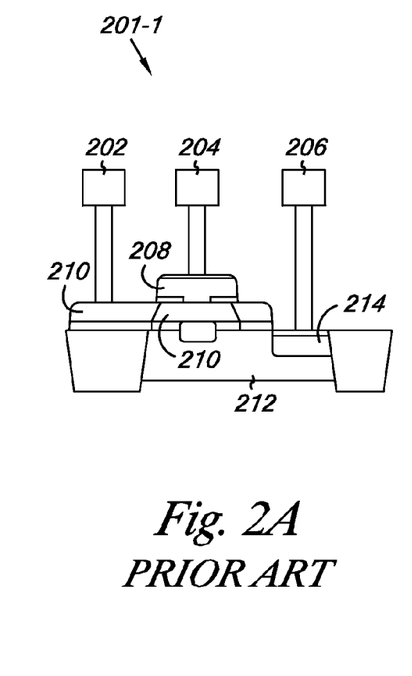
FIG. 2A illustrates the npn heterojunction bipolar transistor (HBT) structure for a BiCMOS process.

FIG. 2A illustrates an npn heterojunction bipolar transistor (HBT) structure for a BiCMOS process. The npn bipolar structure 201-1 in FIG. 2A is a common npn configuration. The emitter 208 of this transistor is not self-aligned to the base and hence requires the large footprint of the base 210 and the collector 212, 214 to allow the leads to connect their respective regions.

Complementary bipolar transistors are also used in BiCMOS configurations. A complementary bipolar process with isolated SiGe:C npn and pnp bipolar transistor has also been developed for use in high speed applications. FIG. 2B shows the npn HBT structure 201-2 of the complementary BiCMOS process.

Figure 2B:
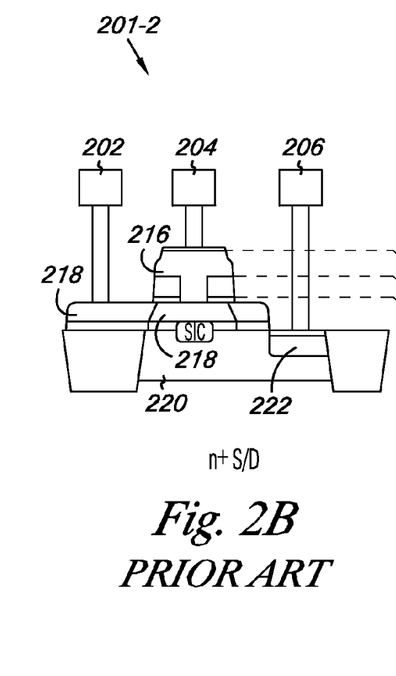
FIG. 2B illustrates the npn heterojunction bipolar transistor (HBT) structure of the complementary BiCMOS process.
Figure 2C:
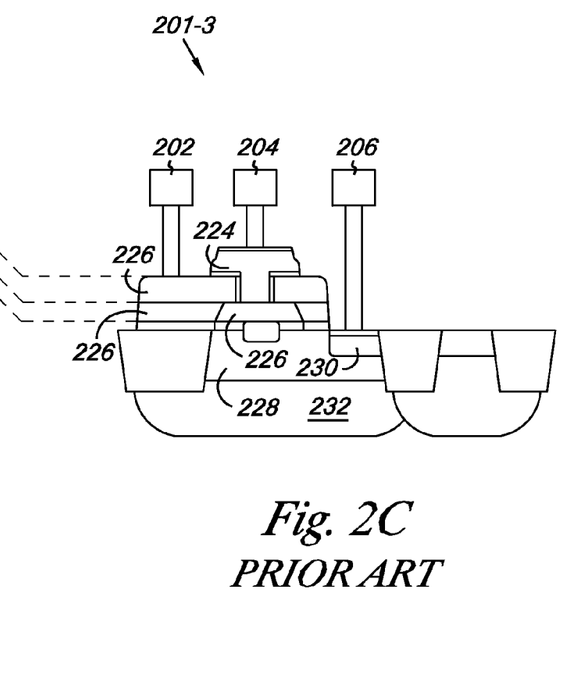
FIG. 2C illustrates the pnp heterojunction bipolar transistor (HBT) structure of the complementary BiCMOS process

FIG. 2C shows the pnp HBT structure 201-3 of the complementary BiCMOS process. The npn HBT structure 201-2 and the pnp HBT structure 201-3 are both formed in the same fashion and share the same basic configuration with base leads 202, emitter leads 204, and collector leads 206 that connect to the respective regions of the npn and pnp transistors. The npn structure 201-2 in FIG. 2B and the pnp structure 201-3 of FIG. 2C both have a large footprint for the base 218, 226 because of the non-self-alignment of emitter and base and the space required between intrinsic base and isolation. In FIG. 2B the collector 220 and the emitter 216 are separated by the base 218. In FIG. 2C a similar configuration is used for the pnp structure, whereby the n-type emitter polysilicon film 216 from FIG. 2B is deposited at the same time as the base 226 in the pnp structure which is indicated by the dotted lines. The collector 228 and emitter 224 of the pnp structure 201-3 are heavily doped p-type.

The structures in FIGS. 2A, 2B, and 2C show pnp and npn devices that can be integrated into a complementary bipolar process or a complementary bipolar BiCMOS process. These configurations have high performance characteristics, but exhibit too large an area for nanoscale applications.

Figure 3:
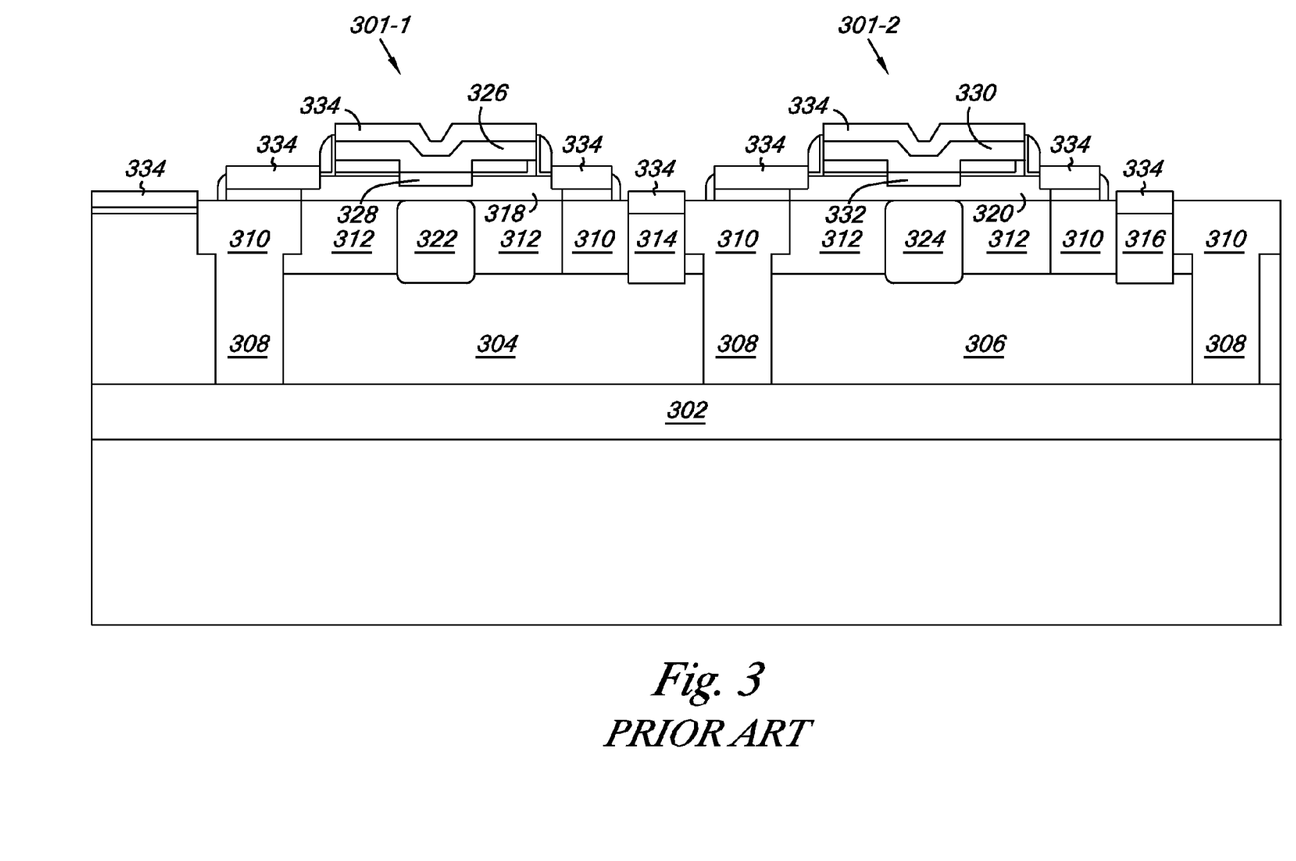
FIG. 3 illustrates complementary npn and pnp silicon germanium (SiGe) bipolar structures on a silicon-on-insulator (SOI) substrate.

FIG. 3 shows a complementary bipolar transistor structure. The transistors in FIG. 3 are made with silicon germanium (SiGe) on a silicon-on-insulator (SOI) substrate that can also be merged with CMOS. FIG. 3 shows both a pnp configuration 301-1 and an npn configuration 301-2. The npn and the pnp transistors in the complementary configuration have similar architectures with regions of opposite dopant polarities. The complementary bipolar transistor structure starts with and insulator layer 302 covered by single crystal silicon upon which a buried p-layer 304 and a buried n-layer 306 are formed. An intrinsic layer 312 is epitaxially grown. The pnp transistor is built over the buried p-layer 304 and the npn transistor is built over the buried n-layer 306. The pnp and npn transistors are separated by shallow trench isolation 310 and deep trench isolation 308 formed by patterning, filling with a dielectric, and planarizing. The npn base 320 and the pnp base 318 are deposited with SiGe or SiGe:C profiles. The emitter is then formed by depositing insulators and patterning the polysilicon region 326, 330 and annealing to form a single crystal diffused region 328, 332. A selectively implanted collector 322, 324 is immediately under the intrinsic base and surrounded by collector epitaxy 312. The collector is connected to the surface of the structure with a $P^+$ sinker 314 and an $N^+$ sinker 316. The structure is then covered with a silicide layer 334 to allow for the leads to connect to the collector, base and emitter for each transistor. The buried insulator layer 302 in this configuration vertically separates the two structures from each other and from other components on the chip. The complementary bipolar transistor configurations shown in FIG. 3 are again limited in their application to high performance nanoscale electronic circuits by the large area these structures occupy.

The use of bipolar transistors is desirable because of their high performance characteristics. As described above, their integration with CMOS processes can also be done to improve performance of the transistors, but with increased complexity and power requirements. In the various embodiments of the present disclosure, a bipolar transistor is created using fabrication techniques that decrease the transistor size while maintaining the high performance characteristics of a bipolar transistor.

Figure 4:
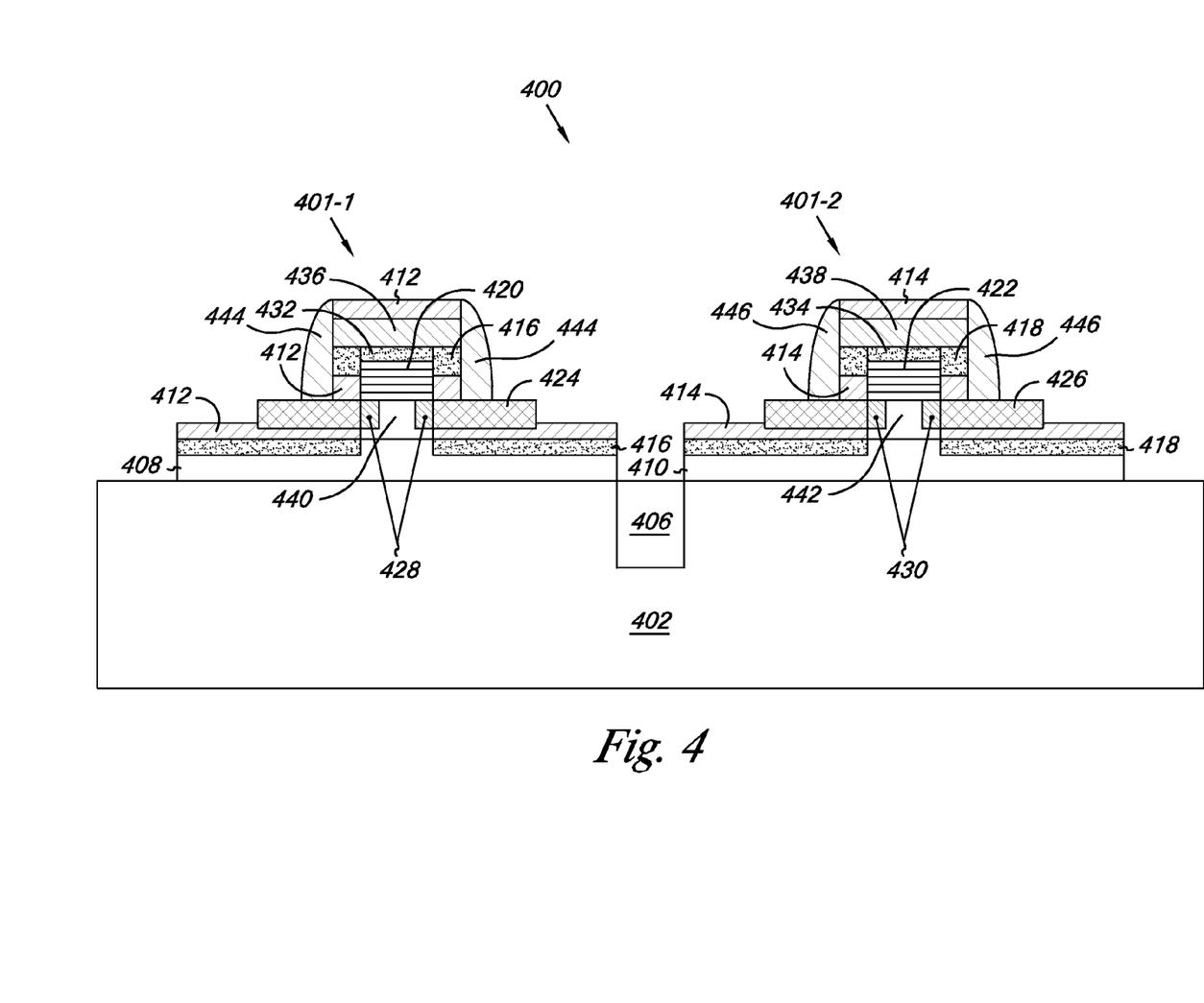
FIG. 4 illustrates a cross-sectional view of a complementary bipolar npn and pnp vertically base-connected transistor according to an embodiment of the present disclosure.

FIG. 4 is a cross-sectional view of a complementary bipolar npn 401-1 and pnp 401-2 vertically base-connected bipolar transistor 400 according to an embodiment of the present disclosure. The complementary bipolar transistor 400 in FIG. 4 consists of an npn transistor 401-1 and a pnp transistor 401-2. The embodiment in FIG. 4 has a substrate 402 that acts as a support for the building of complementary bipolar transistors. A deep trench insulator 406 is formed in the substrate 402 to horizontally insulate the npn 401-1 and the pnp 401-2 vertically base-connected bipolar transistors. The deep trench insulator 406 can be made of any insulating material, such as silicon dioxide or other dielectrics.

In various embodiments, an array of complementary bipolar transistors can be formed. The substrate 402 can be silicon on insulator (SOI), bulk with appropriate wells, or any other suitable material. An npn bipolar transistor, e.g., 401-1, can be formed on the surface of the substrate 402 and a pnp bipolar transistor, e.g., 401-2, can also be formed on the surface of the substrate 402. The two transistors, e.g., 401-1 and 401-2, form a complementary bipolar transistor 400 and are separated by an insulating layer 406. In various embodiments, the formation of this configuration can be continued throughout the surface of the substrate 402 to form an array of complementary bipolar transistors.

In the embodiment illustrated in FIG. 4, the npn transistor 401-1 has an $N^+$ layer 408 on the surface of the substrate 402 that acts as the collector for the transistor. The base for the npn transistor 401-1 consists of an intrinsic base region 420, an extrinsic base region 424, and base links 428. The intrinsic base region 420 consists of single crystal silicon having an appropriate vertical SiGe or SiGe:C profile. The extrinsic base region 424 is p-type, typically consisting of boron-doped polysilicon. The extrinsic base region 424 is annealed to activate and drive-in dopants to the single crystal silicon 440 which in turn forms the base links 428 that vertically link the extrinsic base to the intrinsic base.

The emitter in the npn transistor 401-1 consists of two regions, a polysilicon region 436 from which a single crystal region 432 is diffused. The polysilicon region 436 has an area that accommodates a contact and a lead to the emitter. The polysilicon region 436 is typically doped with arsenic. The single crystal region is formed during a thermal cycle when the dopants are driven into the intrinsic base region to form the single crystal emitter 432.

The npn transistor 401-1 structure also includes thin sidewalls 444, preferable nitride, that act as an insulator and form the architecture for forming the extrinsic base region 424. The oxide 416 and nitride 412 layers also act as insulators while controlling the vertical and horizontal geometry of the structure.

The pnp transistor 401-2 of FIG. 4 has a similar configuration to the npn transistor 401-1 described above. The embodiment of the pnp transistor 401-2 in FIG. 4 also is form on substrate 402 that acts as the support for the pnp transistor 401-2.

In the embodiment illustrated in FIG. 4, the pnp transistor 401-2 has a $P^+$ layer 410 on the surface of the substrate 402 that acts as the collector for the transistor. The base for the pnp transistor 401-2 consists of an intrinsic base region 422, an extrinsic base region 426, and base links 430. The intrinsic base region 422 consists of single crystal silicon with a vertical SiGe or SiGe:C profile. The extrinsic base region 426 consists of arsenic-doped polysilicon. The extrinsic base region 426 is annealed to activate and drive-in dopants to the single crystal silicon 442 which in turn forms the base links 430.

The emitter in the pnp transistor 401-2 consists of two regions, a polysilicon region 438 from which a single crystal region 434 is diffused. The polysilicon region 438 has an area that accommodates a contact and lead to the emitter. The polysilicon region 438 is typically doped with boron. The single crystal emitter region 434 is formed during a thermal cycle when the dopants are driven into the intrinsic base region 422 to form the single crystal emitter 434.

The pnp transistor 401-2 structure also includes nitride sidewalls 446 that act as an insulator and form the architecture for forming the extrinsic base region 426. The oxide 418 and nitride 414 layers also act as insulators while controlling the vertical and horizontal geometry of the structure.

The structure of the complementary vertically base-connected bipolar transistor 400 in FIG. 4 has advantages over the prior art bipolar transistor structures shown in FIGS. 1-3. For instance, the vertical connection of the base links 428, 430 shown in FIG. 4 allow for the transistors 401-1 and 401-2 in FIG. 4 to occupy much less space on the horizontal plane. The vertical connection in transistor 400 in FIG. 4 differs from the wide base connection in of the transistor in FIG. 3 due to the large horizontal footprint of the emitter 326, 330 and the large area occupied by the base 318, 320. The smaller area that the vertically base-connected bipolar transistor 400 occupies is advantageous due to its ability to be applied in nanoscale electric circuits in a denser manner, while maintaining high performance characteristics.

FIGS. 5A-5H illustrate a fabrication process for a vertically base-connected bipolar transistor in an npn configuration according to an embodiment of the present disclosure. These figures show a process of fabricating an embodiment of a vertically base-connected bipolar transistor, e.g., npn bipolar transistor 401-1 shown in FIG. 4. Various embodiments of the vertically base-connected bipolar transistor use sidewall base links to considerably reduce the transistor size that can be used on a bulk or a silicon-on-insulator (SOI) wafer. The embodiment in FIGS. 5A-5H illustrates a vertically base-connected npn bipolar transistor. Other embodiments, such as a vertically base-connected pnp bipolar transistor, can be formed by the same process illustrated in FIGS. 5A-5H with an appropriate change of dopant polarities and impurity profiles.

Figure 5A:
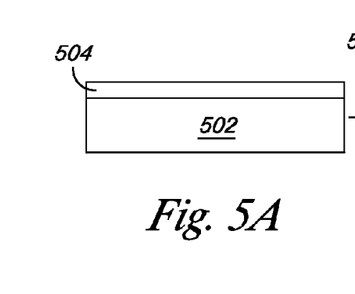
FIGS. 5A-5H illustrate a fabrication process for a vertically base-connected bipolar transistor in an npn configuration according to an embodiment of the present disclosure.
Figure 5B:
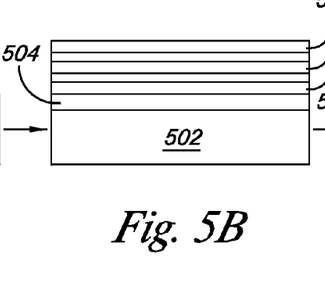

The process begins by implementing a buried $N^+$ layer to form the sub-collector 504 on a substrate 502 as shown in FIG. 5A. In FIG. 5B, thin oxide-nitride films are deposited by alternating oxide 506 and nitride 508. The film thickness is chosen to satisfy requirements on selective subsequent etching and vertical spacing between doped layers.

Figures 5C, 5G:
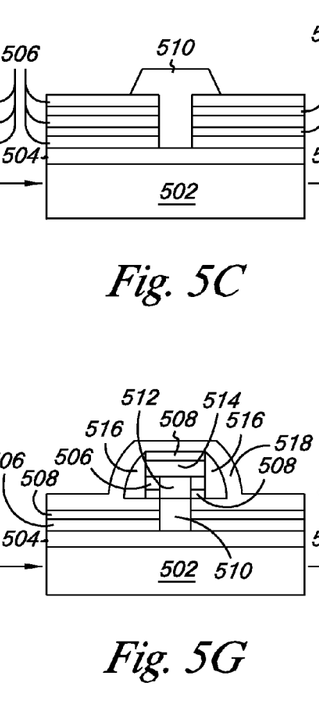

FIG. 5C shows an opening vertically etched down to the buried $N^+$ layer 504. Single crystal silicon 510 can then be selectively grown in the opening, and modulated during growth to result in a vertical silicon-germanium (SiGe) or silicon-germanium-carbon (SiGe:C) profile to form the intrinsic base region 512, shown in FIG. 5D. In various embodiments, a profile begins with intrinsic silicon and gradually incorporates SiGe or SiGe:C at a concentration profile to optimize specific parameters depending on desired operational characteristics, which is illustrated for a typical SiGe profile in FIG. 6 and described below. The selectively grown silicon is then planarized to the top oxide film, e.g., top oxide film 506 as shown in FIG. 5C. The planarization can be accomplished through methods such as chemical-mechanical planarization (CMP) among various other methods. A thin nitride film can be deposited on the oxide layer 506 to facilitate the CMP process.

In various embodiments, a thin layer (not shown) of interface oxide (IFO) at the interface between emitter polysilicon and base can be formed immediately before depositing the emitter polysilicon without breaking the vacuum. In such embodiments, the thickness of the interface oxide layer can be about 0.3-0.4 nm, among other thicknesses. This layer is not shown in the figures as it is very thin and not practical to incorporate into the figures. The presence of interface oxide can reduce the base current predominately by hole tunneling through the oxide at a probability of approximately $10^{-3}$. Reducing the base current can increase the injection efficiency and hence bipolar gain. In embodiments in which an interface oxide layer is used, controlling the thickness of the layer can minimize the variability of gain and related bipolar parameters. In various embodiments atomic layer deposition (ALD) or other processes can be used to deposit this film.

Figure 5D:
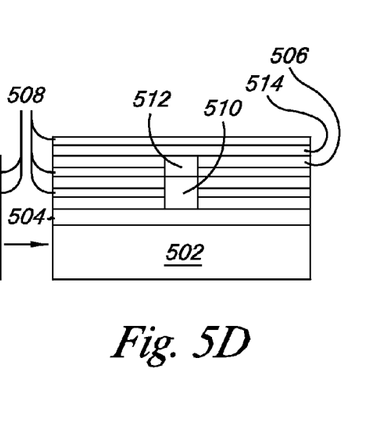
Figure 5E:
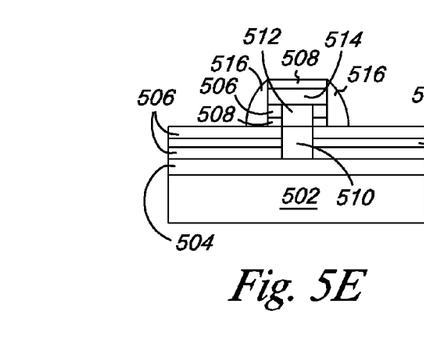
Figure 5F:
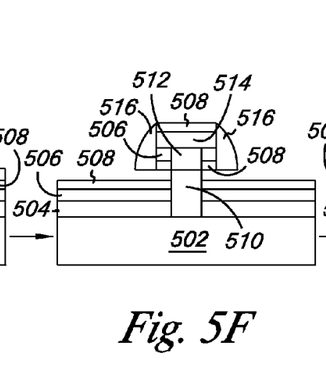
Figure 5H:
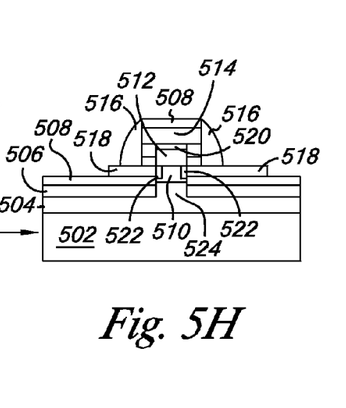

As illustrated in FIG. 5D, an arsenic doped emitter polysilicon film 514 is deposited over the top oxide layer 506 and the intrinsic base region 512. The polysilicon film can be deposited intrinsically and then implanted with an n-type dopant, such as arsenic. It can be deposited in-situ doped, e.g., with arsenic. A thin nitride cap 508 is then deposited and the stack etched to pattern the nitride covered emitter, as shown in FIG. 5E. A sidewall thin nitride film 516 is then deposited and etched directionally, down to the underlying oxide film 506. The top oxide film 506 is etched from the structure to expose the single crystal silicon 510, as shown in FIG. 5F. This top oxide layer 506, shown in FIG. 5E, can be initially doped to accelerate its wet-etch and removal from under the nitride-encapsulated emitter 514.

In FIG. 5G, a boron-doped polysilicon extrinsic base film 518 that serves as the npn base connection is then deposited such that it contacts the single crystal silicon pillar 510 on its sides. In some embodiments, the polysilicon extrinsic base film 518 can be deposited intrinsically and then implanted with boron. The boron diffuses rapidly (when compared to diffusion in single-crystal silicon) through the polysilicon extrinsic base film 518 to reach the sides of the vertical single crystal silicon pillar. The polysilicon extrinsic base film 518 is then patterned and the structure annealed to activate and drive-in dopants. Annealing can also be performed at separate processing steps to individually control the base and emitter profiles. The polysilicon extrinsic base film 518 is driven horizontally to form base links 522 that connect vertically to the intrinsic base 512. Dopants from the sub-collector 504 are also driven vertically to form collector region 524. The dopants from the emitter polysilicon film 514 are also driven vertically to form a single crystal emitter 520. This thermal cycle process is thus chosen to optimize dopant activation and diffusion from emitter poly 514, base-poly 518 and sub-collector 504 to result in desired emitter 520, intrinsic base 512, and base-link 522.

The vertical base links 522 can reduce the transistor size but also can improve noise by reducing the base resistance. The vertical base links 522 that contact the intrinsic base 512 can be adjusted by varying the thickness of the dielectric oxide 506 and nitride 508 films that separates emitter and base. Similarly, the spacing between base links 522 and collector 524 that determine the base-collector breakdown voltage and capacitance can be adjusted by varying the thickness of films separating base and collector.

Figure 6:
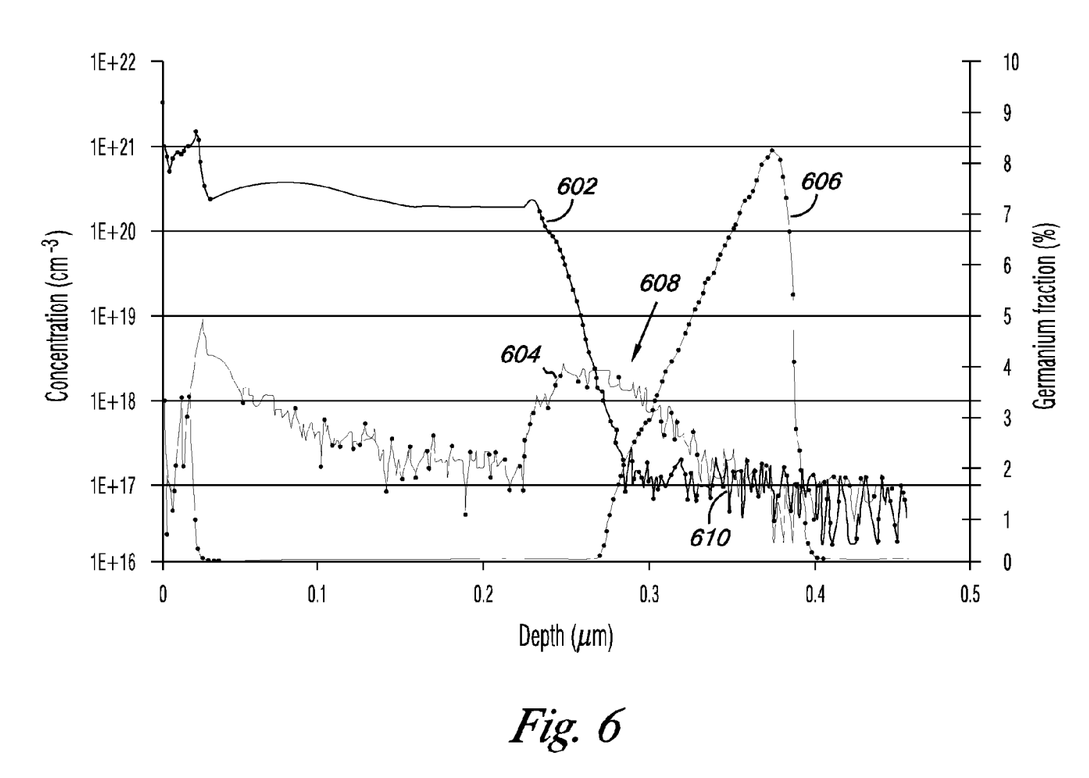
FIG. 6 illustrates a typical triangular germanium profile in the intrinsic base of a vertically base-connected bipolar transistor that can be scaled to an embodiment of the present disclosure.

FIG. 6 illustrates an example of a germanium profile (in this case triangular) that can be applied to the intrinsic base of a vertically base-connected bipolar transistor according to an embodiment of the present disclosure. FIG. 6 shows the emitter 602, the base 604, and the collector 610. The polysilicon region of the emitter 602 starts at a depth of 0.0 μm and continues to a depth of about 0.23 μm. At this depth, the single crystal region of the emitter 602 begins, as shown by the downward slope of the emitter profile. The graph of FIG. 6 shows the emitter 602 and the base 604 intersecting at a depth of approximately 0.28 μm. The base 604 and the collector 610 intersect at depth of approximately 0.35 μm. The germanium profile 606 starts typically near the emitter-base junction and merges into the collector. The width of the base with the germanium profile is approximately the distance between where the emitter 602 and the base 604 intersect and where the base 604 and the collector 610 intersect. The performance characteristics of the transistor can be optimized to perform in a desired manner by changing the location and concentration of the silicon germanium profile in the intrinsic base region. Various embodiments can include SiGe or SiGe:C profiles that are box, trapezoidal, or other forms.

CONCLUSION

Methods, devices, and systems for using and forming vertically base-connected bipolar transistors have been shown. The vertically base-connected bipolar transistors in the embodiments of the present disclosure are formed with fabrication techniques that decrease the transistor size while maintaining the high performance characteristics of a bipolar transistor.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A bipolar transistor, comprising:
    a collector on a semiconductor substrate;
    a vertically grown single crystalline silicon pillar;
    an emitter formed from a polysilicon material and a vertically grown single crystal material formed separated from the collector by oxide and nitride; and
    a vertical base contact with an intrinsic base region formed in the single crystalline silicon pillar, and extrinsic base region, and a number of base links, wherein the entire intrinsic base region is formed above the extrinsic base region, wherein the number of base links each have an upper surface that contacts a bottom surface of the intrinsic base region and vertically link the extrinsic base region to the intrinsic base region, and wherein the number of base links are at least partially in an area below the emitter and at least partially in an area between a first sidewall of the emitter and a second sidewall of the emitter.

2. The transistor of claim 1, wherein the transistor is in a npn configuration.

3. The transistor of claim 1, wherein the intrinsic base region is silicon germanium (SiGe).

4. The transistor of claim 1, wherein the intrinsic base region is silicon germanium carbon (SiGe:C).

5. The transistor of claim 1, wherein the extrinsic base region is polysilicon.

6. The transistor of claim 1, wherein the vertical base contact includes the number of based links formed in a thermal cycle that connects the intrinsic and extrinsic regions of the base link.

7. The transistor of claim 1, wherein the transistor is in a pnp configuration.

8. A bipolar circuit, comprising:
    an array of complementary vertically oriented base-connected bipolar transistors;
    wherein the at least one transistor includes:
        a collector on a semiconductor substrate;
        a vertically grown single crystalline silicon pillar;

an emitter formed from a polysilicon material and a vertically grown single crystal material formed; and a vertical base contact with an intrinsic base region formed in the single crystalline silicon pillar, an extrinsic base region, and a number of base links, wherein the entire intrinsic base region is formed above the extrinsic base region, wherein the number of base links each have an upper surface that contacts a bottom surface of the intrinsic base region and vertically link the extrinsic base region to the intrinsic base region, and wherein the number of base links are at least partially in an area below the emitter and at least partially in an area between a first sidewall of the emitter and a second sidewall of the emitter; and circuitry for control and access to the array of complementary vertically base-connected bipolar transistors.

9. The bipolar circuit of claim 8, wherein the vertical base contacts are composed of a silicon germanium (SiGe) intrinsic region and a polysilicon extrinsic region.

10. The bipolar circuit of claim 8, wherein the vertical base contacts are composed of a silicon germanium carbon (SiGe:C) intrinsic region and a polysilicon extrinsic region.

11. The bipolar circuit of claim 8, wherein the intrinsic base region and extrinsic base region are connected by a base link formed during a thermal cycle.

12. The bipolar circuit of claim 8, wherein the vertical base contact is confined between the emitter and the collector.

13. The bipolar circuit of claim 8, wherein the bipolar circuit is implemented as a digital circuit.

14. The bipolar circuit of claim 8, wherein the bipolar circuit is implemented as an analog circuit.

15. The bipolar circuit of claim 8, wherein the bipolar circuit is integrated with CMOS in a bipolar complementary metal oxide semiconductor (BiCMOS).

* * * * *